United States Patent
Rien et al.

(10) Patent No.: US 8,395,433 B2
(45) Date of Patent: Mar. 12, 2013

(54) INPUT-OUTPUT DEVICE PROTECTION

(75) Inventors: Mikael Rien, Saint Ismier (FR); Jean-Claude Duby, Saint Egreve (FR)

(73) Assignee: ARM Limited, Cambridge (GB)

( * ) Notice: Subject to any disclaimer, the term of this patent is extended or adjusted under 35 U.S.C. 154(b) by 352 days.

(21) Appl. No.: 12/662,500

(22) Filed: Apr. 20, 2010

(65) Prior Publication Data
US 2010/0264974 A1   Oct. 21, 2010

(30) Foreign Application Priority Data
Apr. 20, 2009   (GB) .................................. 0906767.9

(51) Int. Cl.
*H03L 5/00* (2006.01)

(52) U.S. Cl. ........ 327/313; 327/108; 327/374; 327/264; 326/21; 326/82

(58) Field of Classification Search .......... 327/108–112, 327/170, 374–377, 379, 284; 326/21–24, 326/82–84, 89
See application file for complete search history.

(56) References Cited

U.S. PATENT DOCUMENTS
6,081,132 A      6/2000   Isbara
6,130,563 A  *  10/2000   Pilling et al. .................. 327/111
6,388,470 B1     5/2002   Mattos et al.

FOREIGN PATENT DOCUMENTS
WO    WO 2005/062468   7/2005

OTHER PUBLICATIONS
Search Report for GB 0906767.9 dated Aug. 17, 2009.

* cited by examiner

*Primary Examiner* — Lincoln Donovan
*Assistant Examiner* — Shikha Goyal
(74) *Attorney, Agent, or Firm* — Nixon & Vanderhye P.C.

(57) ABSTRACT

A cascoded input-output device is provided configured to receive at an input node a lower voltage input signal and to generate at an output node a higher voltage output signal. The input-output device is split into two voltage domains to enable output signals in a larger range to be generated, while the components of the input-output device individually operate in a smaller range. By applying a selected bias voltage to a protected node of the cascoded input-output device, first changing that selected bias voltage in response to a transition of the input signal and then switching that selected bias voltage back when the output signal reaches a predetermined level, that node is protected, either avoiding stress-inducing voltage swings or providing a switching speed increasing charge boost.

21 Claims, 8 Drawing Sheets

INPUT-OUTPUT DEVICE PROTECTION

BACKGROUND OF THE INVENTION

1. Field of the Invention

The present invention relates to input-output devices and in particular to the protection of components of cascoded input-output devices which interface between two voltage domains.

2. Description of the Prior Art

It is known to provide input-output devices which transform a signal in one voltage domain into a signal in another voltage domain. For example, in the SOC (system-on-chip) context, whilst on-chip components may operate in a lower voltage domain, it is often desirable for these components to be able to pass signals off-chip, where such signals may be defined in a higher voltage domain. This may for example be due to a given communication protocol to which the signals should adhere.

Whilst techniques are known for providing such functionality, difficulties arise with the trend for on-chip components to become ever smaller. With state of the art CMOS technologies, both core and I/O (input-output) device power supplies have moved to lower voltages in order to reach the contemporary speed and power consumption levels required. In parallel, transistor dimensions and oxide thicknesses have also decreased.

For example, in 45 nm technologies, the "standard" external power is now 1.8V (where it was 3.3V or 2.5V at previous technology scales). To be able to reach the high frequencies demanded of these 1.8V devices, the oxide thickness has decreased to around 28 to 32 Å (where it was previously around 50 Å).

However, in order to be compatible with older devices and some existing standard protocols, it is desirable for input-output devices to be able to operate at a higher voltage than their nominal voltage (e.g. an I/O device operating at 1.8V nominal voltage domain being able to interface with a 3.3V voltage domain).

Such an arrangement can be problematic, due to the potential for I/O components in the 1.8V voltage domain to be exposed to excessive voltage differences, potentially overstressing those components. This overstress can lead to reduced component lifetimes due such phenomena as oxide breakdown and hot carrier injection (HCI).

In particular, in the example of such I/O devices which interface between two voltage domains, problems can arise during switching events (i.e. when the input signal transitions, thus causing the output signal to transition) when transient stress on components can easily arise. These problems are particularly problematic in the output buffer of the I/O device, since a large off-chip load may be being driven, meaning that these stressful transient events can occur for a non-negligible period of time.

Furthermore, in the context of these ever-smaller technology scales, it is typically a key requirement that power consumption should be kept as low as possible, meaning that it is highly desirable for the DC power consumption of such devices to be kept as low as possible.

FIG. 1 schematically illustrates the output buffer 10 of such an I/O device, wherein the output voltage supplied to PAD 20 (for connection to an off-chip device) is configured to range between 0V and 3.3V (GND to DVDD). In order to provide this output range with I/O components configured to operate in a lower voltage range (in this example in a range of 1.8V), the output buffer driver switches (PFET 30 and NFET 60) are each cascoded with an output buffer cascode switch (PFET 40 and NFET 50). In the arrangement illustrated, the I/O device inverts the output signal with respect to the input signal. The gates of each output buffer cascode switch is tied to 1.8V. The output buffer can thus be seen itself to be divided into an upper voltage domain (generally denoted 70) and a lower voltage domain (generally denoted 80), the upper voltage domain ranging from 1.8V to 3.3V and the lower voltage domain ranging from 0V to 1.8V.

This arrangement of the output buffer 10 provides reliable performance in DC situations, but the cascode switches 40 and 50 can suffer from VDS (voltage drain-source) overstress during transients. In other words, when the input signal (divided by a level shifter (not illustrated) to form the inputs into driver switches 30 and 60) transitions, causing the output voltage to transition on PAD 20, the drain-source voltage across each of these transistors can exceed their tolerances. For example, in the situation where the PAD voltage transitions from high to low (3.3V to 0V), the PFET 30 is switched off (by the rising transition of the input signal). At the same time, NFET 60 switches on and begins to lower the voltage at the intermediate point int-N between the NFETs 50 and 60. However, the PAD voltage only starts to fall once NFET 50 has sufficient gate-source voltage (VGS) to sink the current. This means that by the time the PAD voltage starts to fall, int-N is already so low that it creates some VDS stress (potentially leading to HCI damage—also known as hot carrier degradation) on NFET 50. The same effect can also affect PFET 40 on a rising transition of the PAD voltage, due to the voltage at the intermediate point int-P beginning to rise before PFET 40 has sufficient VGS to sink the current.

FIG. 2 illustrates a simulation of the potential VDS stress that could be caused to an NFET transistor such as cascode switch 50 in FIG. 1, in the case where the PAD voltage $V_{PAD}$ makes a high to low transition. It can be seen that the voltage at int-N $V_{int\text{-}N}$ falls sharply, causing a spike in the VDS of the cascode transistor, before its VGS is sufficient for the cascode transistor to turn on. In particular, it can be seen that the VDS of NFET 50 peaks at around 3.05V, stressing this component which operates at 1.8V nominal voltage. The current in the NFETs $I_{NFET}$ is also shown.

Whilst increasing the gate length could go some way to reducing this effect, such techniques are insufficient to adequately counteract this problem. Alternatively a triple cascode output buffer could be provided, yet this would result in an undesirably large I/O device.

Accordingly, it would be desirable to provide an improved technique which enabled input-output devices to provide a power-efficient interface between voltage domains, without the components of those input-output devices that are designed to operate in a lower voltage domain being stressed by exposure to excessive voltage differences resulting from the interface to a higher voltage domain.

SUMMARY OF THE INVENTION

Viewed from a first aspect, the present invention provides a cascoded input-output device configured to receive at an input node a lower voltage input signal and to generate at an output node a higher voltage output signal, said cascoded input-output device having a lower voltage domain and an upper voltage domain, said cascoded input-output device comprising: a first driver switch in series with a first cascode switch in said lower voltage domain; a second driver switch in series with a second cascode switch in said upper voltage domain; a bias switch configured to set a bias voltage selected from a high bias voltage and a low bias voltage in dependence on a bias steering signal, said bias voltage being applied to a protected node of said cascoded input-output device; clamp circuitry configured to provide a clamped voltage, said clamped voltage being a clamped version of said output signal and being clamped at a maximum voltage of said lower voltage domain; and switch steering circuitry configured to perform bias switching by generating said bias steering signal to cause said bias switch to change said bias voltage from an initial value in response to a transition of said input signal and to cause said bias switch to return said bias voltage back to said initial value in response to said clamped voltage reaching said maximum voltage of said lower voltage domain.

In a cascoded input-output device configured to receive at an input node a lower voltage input signal and to generate at an output node a higher voltage output signal, the period immediately following a transition of the input signal has been identified as a moment in which components of the cascoded input-output device can be stressed by transient excessive voltage differences. According to the techniques of the present invention, a protected node of the cascoded input-output device can be established by applying to the protected node a bias voltage selected from a high bias voltage and a low bias voltage. The bias voltage is selected in dependence on a bias steering signal, generated by switch steering circuitry. The bias voltage is thus changed from an initial value when the input signal makes a transition. The output signal is used to generate a clamped output signal, which is clamped at the maximum voltage of the lower voltage domain. The bias voltage is returned to its initial value when the clamped voltage has reached that maximum voltage of the lower voltage domain.

In this way, during a period in which various nodes of the cascoded input-output device are vulnerable, the provision of a protected node onto which selected bias voltages are applied in dependence on the instantaneous level of the input and output voltages, ensures that protection for this node is provided. The protection afforded by the applied bias voltage can manifest itself for example as a reduction in the VDS stress on a cascoded device—increasing the durability and reliability of the cascoded input-output device, or in another example may manifest itself as an increased operational speed associated with that node, which would otherwise take an undesirable length of time to charge or discharge. Furthermore, the techniques of the present invention provide such protection without resort to approaches that would result in DC power consumption during the non-transient state of the input/output signals.

Whilst operating, the additional components required to implement the present invention dissipate a small amount of power, this only occurs during transients and is therefore not significant. In particular it should be noted that the power required to enable the components required for the techniques of the present invention is typically negligible in comparison to the power needed to drive the large off-chip loads that such a cascoded input-output device is intended to supply.

In one embodiment said protected node is a gate of a protected switch, said protected switch being one of said first cascode switch and said second cascode switch; and said bias switching provides that a transient overvoltage across said protected switch is avoided. Due to the cascoded arrangement of switches in the output buffer of the cascoded input-output device, these cascode switches in particular are vulnerable to a transient overvoltage across them. Providing a protected node at the gate of one of these switches results in that switch being a protected switch, whereby a transient overvoltage across it is avoided.

In another embodiment said protected node is situated between said first driver switch and said first cascode switch; and said bias switching impedes a transient voltage rise at said protected node. Due to the cascoded arrangement of switches in the output buffer of the cascoded input-output device, the point between the first driver switch and its associated first cascode switch is vulnerable to a transient voltage rise when the input signal changes, potentially resulting in an undesirably long charge-up time for this point. By counteracting this transient voltage rise, the operational speed of the device is improved, by in effect pre-discharging this point.

In yet another embodiment said protected node is situated between said second driver switch and said second cascode switch; and said bias switching impedes a transient voltage drop at said protected node. Due to the cascoded arrangement of switches in the output buffer of the cascoded input-output device, the point between the second driver switch and its associated second cascode switch is vulnerable to a transient voltage drop when the input signal changes, potentially resulting in an undesirably long discharge time for this point. By counteracting this transient voltage drop, the operational speed of the device is improved, by in effect pre-charging of this point.

In one embodiment said protected switch is said first cascode switch; said transition of said input signal is a rising transition; said clamped voltage is constrained to be at least said maximum voltage of said lower voltage domain; and said switch steering circuitry is configured to cause said bias switch to return said bias voltage back to said initial value in response to said output signal falling to said maximum voltage of said lower voltage domain. The first cascode switch is vulnerable to VDS stress when the input signal makes a rising transition (and thus the output signal makes a falling transition). This cascode switch is thus protected from such VDS stress by switching its bias voltage to a higher value during this transient period, such that the VDS of this switch is pre-positioned to a lower value. Hence when the first driver switch turns on, the first cascode switch will experience lower VDS stress.

In another embodiment said protected switch is said second cascode switch; said transition of said input signal is a falling transition; said clamped voltage is constrained to be at most said maximum voltage of said lower voltage domain; and said switch steering circuitry is configured to cause said bias switch to return said bias voltage back to said initial value in response to said output signal rising to said maximum voltage of said lower voltage domain. The second cascode switch is vulnerable to VDS stress when the input signal makes a falling transition (and thus the output signal makes a rising transition). This cascode switch is thus protected from such VDS stress by switching its bias voltage to a lower value during this transient period, such that the VDS of this switch is pre-positioned to a lower value. Hence when the second driver switch turns on, the second cascode switch will experience lower VDS stress.

It will be appreciated that the cascode and driver switches could take a variety of forms. In embodiments of the present invention said first cascode switch is an NFET transistor; said first driver switch is an NFET transistor; said second cascode switch is a PFET transistor; and said second driver switch is a PFET transistor.

Whilst various reference voltages could be provided for the bias voltages, in one embodiment said low bias voltage is provided by a ground voltage and in one embodiment said high bias voltage is provided by said maximum voltage of said lower voltage domain. In another embodiment said low bias voltage is provided by said maximum voltage of said lower voltage domain and in another embodiment said high bias voltage is provided by said maximum voltage of said upper voltage domain.

The switch steering circuitry could be provided by a variety of logic circuits, but in one embodiment said switch steering circuitry comprises a NAND gate. In another embodiment said switch steering circuitry comprises a NOR gate. Such logic gates present advantageously compact implementations of the required functionality of the switch steering circuitry.

In one embodiment said cascoded input-output device further comprises at said input node a level shifter to convert said lower voltage input signal into a first signal for said lower voltage domain and into a second signal for said upper voltage domain. Such an arrangement provides that the input signal is converted into signals having voltage ranges suitable for use in the respective lower and upper voltage domains of the cascoded input-output device.

Whilst the techniques of the present invention may be used to provide only one kind of protected node, in one embodiment the cascoded input-output device further comprises a further protected node situated between said first driver switch and said first cascode switch; a further bias switch configured to set a further bias voltage in dependence on a further bias steering signal, said further bias voltage being applied to said further protected node of said cascoded input-output device; and further switch steering circuitry configured to perform further bias switching by generating said further bias steering signal to cause said further bias switch to change said further bias voltage from an further initial value in response to said transition of said input signal and to cause said further bias switch to return said further bias voltage back to said further initial value in response to said clamped voltage reaching said maximum voltage of said lower voltage domain, wherein said further bias switching impedes a transient voltage rise at said further protected node. Hence the advantages of preventing VDS stress to the protected switch described above are combined with the operational speed advantages of impeding a transient voltage rise at said further protected node.

Similarly in another embodiment, the cascoded input-output device further comprises a further protected node situated between second driver switch and said second cascode switch; a further bias switch configured to set a further bias voltage in dependence on a further bias steering signal, said further bias voltage being applied to said further protected node of said cascoded input-output device; and further switch steering circuitry configured to perform further bias switching by generating said further bias steering signal to cause said further bias switch to change said further bias voltage from an further initial value in response to said transition of said input signal and to cause said further bias switch to return said further bias voltage back to said further initial value in response to said clamped voltage reaching said maximum voltage of said lower voltage domain, wherein said further bias switching impedes a transient voltage drop at said further protected node. Hence the advantages of preventing VDS stress to said protected switch described above are combined with the operational speed advantages of impeding a transient voltage drop at said further protected node.

Viewed from a second aspect, the present invention provides a method of biasing a voltage applied to a protected node in a cascoded input-output device, the cascoded input-output device configured to receive at an input node a lower voltage input signal and to generate at an output node a higher voltage output signal, said cascoded input-output device having a lower voltage domain and an upper voltage domain, said cascoded input-output device comprising: a first driver switch in series with a first cascode switch in said lower voltage domain; a second driver switch in series with a second cascode switch in said upper voltage domain, the method comprising the steps of: generating a clamped voltage, said clamped voltage being a clamped version of said output signal and being clamped at a maximum voltage of said lower voltage domain; changing a bias voltage applied to a protected node of said cascoded input-output device from an initial value in response to a transition of said input signal; and returning said bias voltage back to said initial value in response to said clamped voltage reaching said maximum voltage of said lower voltage domain.

The above, and other objects, features and advantages of this invention will be apparent from the following detailed description of illustrative embodiments which is to be read in connection with the accompanying drawings.

DESCRIPTION OF EMBODIMENTS

Figure 1:
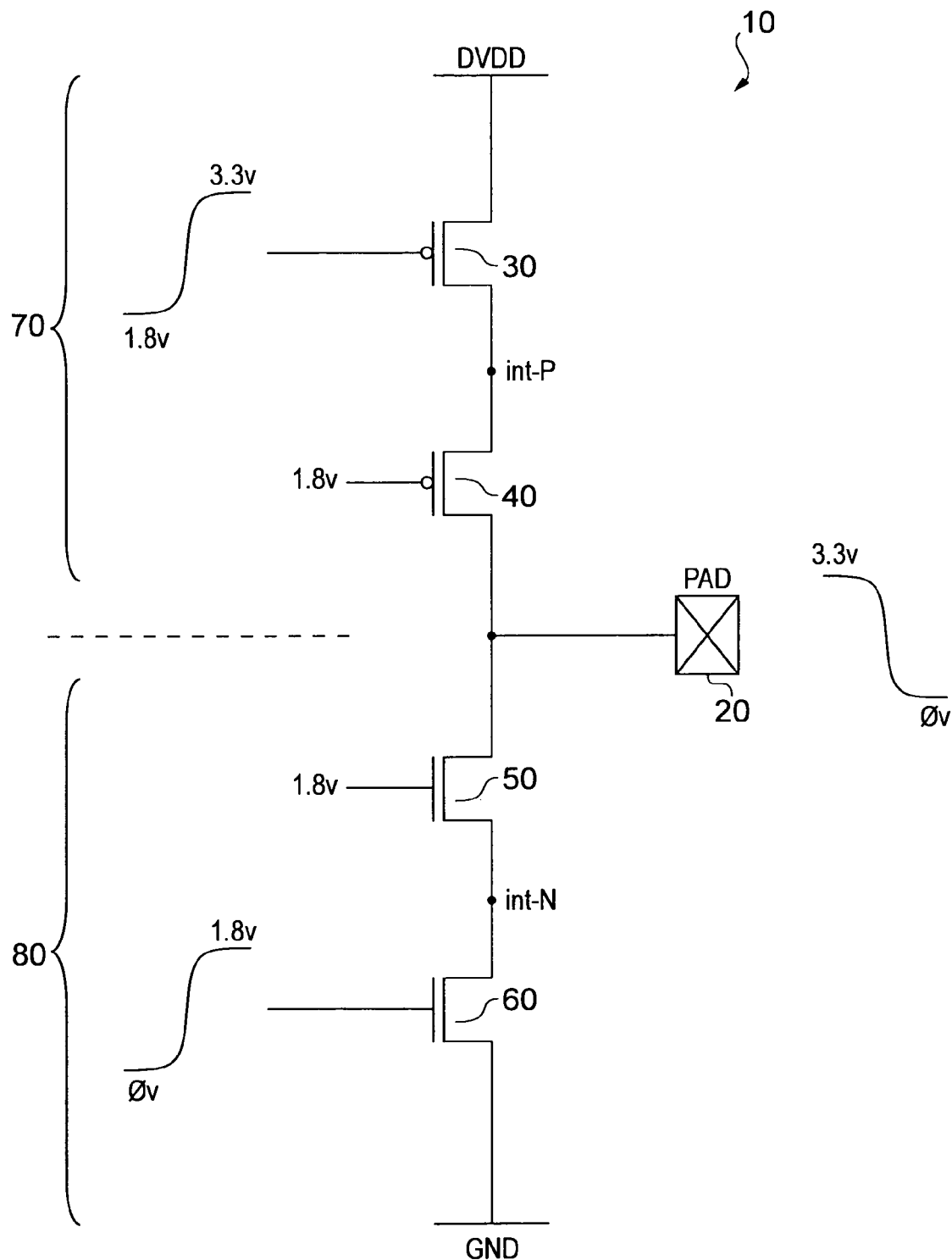
FIG. 1 schematically illustrates a prior art I/O buffer.
Figure 2:
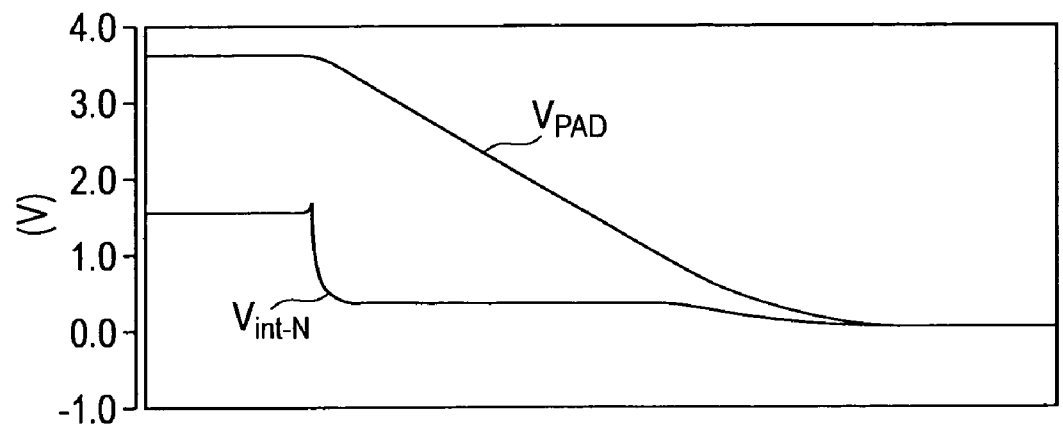
FIG. 2 illustrates a simulation of the development of VDS stress in an NFET transistor in the prior art I/O buffer of FIG. 1.
Figure 2:
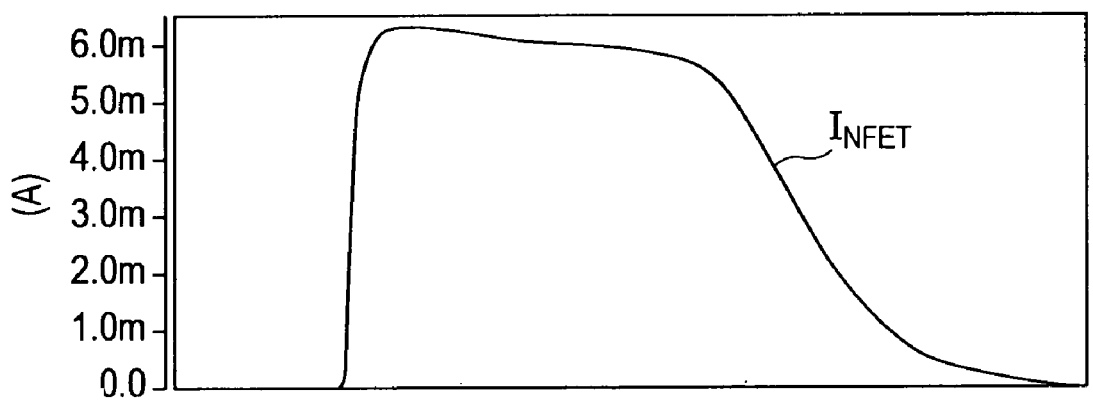
Figure 2:
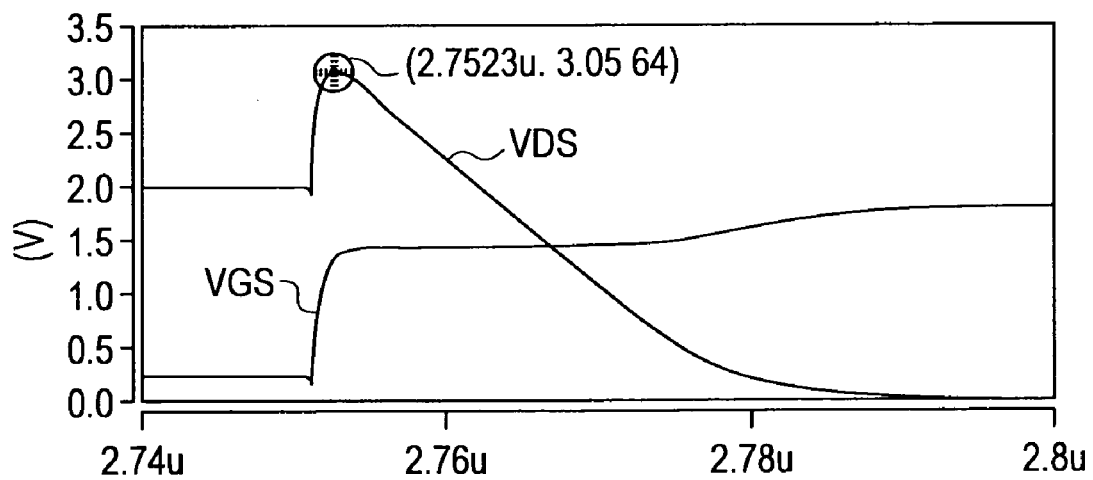
Figure 3:
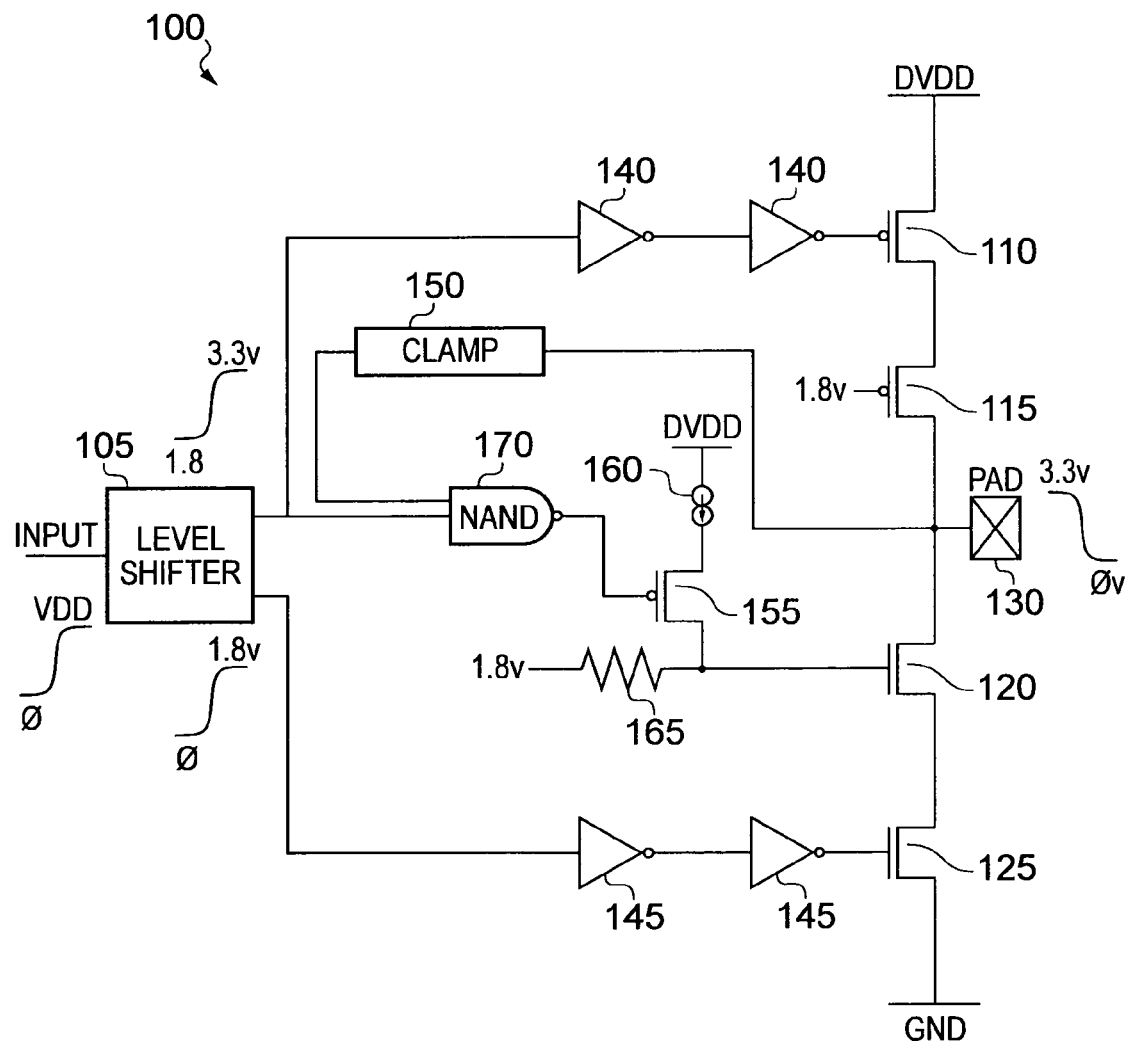
FIG. 3 schematically illustrates a cascoded input-output device according to an embodiment of the present invention.

FIG. 3 schematically illustrates a cascoded input-output device 100 according to one embodiment. An input signal is received by level shifter 105 which converts the input signal into two parallel signals, one used in the lower voltage domain of the cascoded input-output device (ranging from 0V to 1.8V) and one used in the upper voltage domain of the cascoded input-output device (ranging from 1.8V to 3.3V). The input signal itself ranges between 0V and VDD (which in this embodiment is 1.0V)—defined by the input voltage domain.

On the output side, the output buffer comprises a set of cascoded FET transistors: driver switch PFET 110, cascode switch PFET 115, cascode switch NFET 120 and driver switch NFET 125. The output signal can be seen to be inverted with respect to the input signal. Cascode switch PFET 115 has its gate tied to a bias voltage of 1.8V (the lower limit of the upper voltage domain), whilst cascode switch NFET 120 has its gate controlled by bias switch 155 (described further below). The output signal of the device 100 is provided on PAD 130, this output signal being provided in the range 0V to 3.3V, this range being required by the output voltage domain.

The two input signals generated by the level shifter 105 pass via buffers 140 and 145 to their respective driver switch. It will be clear to a skilled person that although two buffers are shown in this embodiment, there could be a different number such as one or three. The lower voltage domain input signal controls the gate of driver switch NFET 125 and the upper voltage domain input signal controls the gate of driver switch PFET 110.

Clamp circuitry 150 is also provided to generate a clamped voltage, the clamped voltage being a clamped version of the output signal taken from PAD 130. In this embodiment the clamped voltage is constrained to take a minimum value corresponding to the maximum voltage of the lower voltage domain, i.e. 1.8V.

A bias switch is provided by PFET transistor 155, configured to set a bias voltage on the gate of cascode switch NFET 120. Bias switch 155 selects between a high bias voltage taken from DVDD (3.3V) via current source 160, and a low bias voltage taken from the upper voltage limit of the lower voltage domain (1.8V) via resistor 165.

Bias switch 155 is itself controlled by a bias steering signal provided by NAND gate 170. NAND gate 170 receives as its two inputs the clamped voltage provided by clamp circuitry 150 and the upper voltage domain input signal provided by level shifter 105.

In this embodiment the goal is to provide a protected node at the gate of cascode switch NFET 120, such that this switch itself is protected from overstress during transients of the input/output signals. Specifically, this switch would otherwise be vulnerable to VDS stress (an above-tolerance voltage drain-to-source) during a rising transition of the input signal.

When the rising input signal is transmitted by level shifter 105, the output at PAD 130 will still be high, and thus NAND gate 170 activates bias switch 155 to pull up the bias voltage being applied to the gate of NFET switch 120. The voltage on the gate of NFET switch 120 thus increases to $1.8V+\Delta V_{ref}$, where $\Delta V_{ref}$ depends on the specific implementation requirements, but should be tuned to be sufficient to protect cascode switch NFET 120.

Hence when the lower voltage domain input signal arrives from buffers 145 at driver NFET switch 125, and activates this switch, a sudden increase in the VDS of NFET switch 120 is avoided.

At the same time the upper voltage domain input signal arrives from buffers 140 at driver PFET switch 110, and hence when the driver switches 110 and 125 have switched, the PAD voltage begins to fall.

Once the PAD voltage has fallen as far as 1.8V, there is no longer any risk of VDS stress to switch 120. At this point the clamp circuitry 150 clamps the falling output voltage at a minimum of 1.8V (since NAND gate 170 is part of the upper voltage domain and would not tolerate a voltage below 1.8V). Also at this point the NAND gate is receiving a logical 0 (1.8V is the lower limit for the upper voltage domain) and the output of the NAND gate causes bias switch 155 to decouple the current source 160 from the gate of NFET 120. By decoupling the current source in this manner, DC dissipation during the non-transient state of the input/output signals is avoided.

Figure 4:
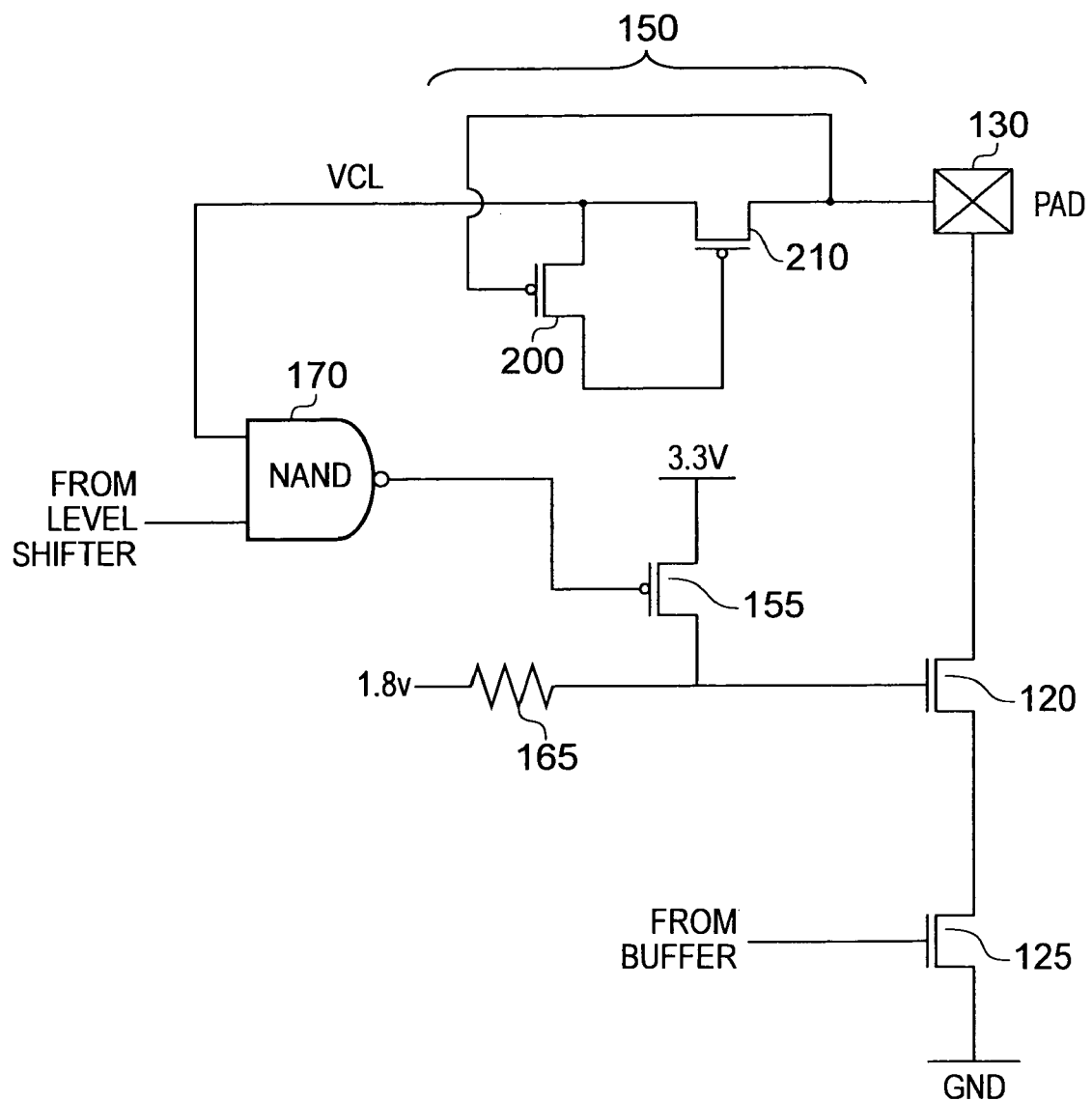
FIG. 4 schematically illustrates the lower voltage domain of a cascoded input-output device according to one embodiment of the present invention.

FIG. 4 provides more detail of the clamp circuitry 150 in the cascoded input-output device 100 illustrated in FIG. 3. In FIG. 4 only the lower voltage domain of the cascoded input-output device 100 is shown for clarity. Furthermore, the level shifter 105, buffers 145 and current source 160 are omitted. Conversely PAD 130, NFET switches 120 and 125, NAND gate 170, bias switch 155 and resistor 165 perform the same functions as described with reference to FIG. 3 and are not described further here.

Clamp circuitry 150 comprises two cross-coupled PFET transistors 200 and 210. The gate of PFET 200 is connected to the output signal at PAD 130. Hence, whilst the output signal at PAD 130 is high, PFET 200 is switched off. The output of PFET 200 provides the gate input to PFET 210, so when PFET 200 is switched off, the input to the gate of PFET 210 is low, activating the switch, and the output signal is provided as clamped voltage VCL. Conversely, when the output signal at PAD 130 falls below the defined threshold of the clamped circuitry (in this example the threshold is 1.8V) PFET 200 is switched on. The input to the gate of PFET 210 is thus high, turning off the switch, and the voltage output at the pad is not affected by the clamping circuit 150.

Figure 5:
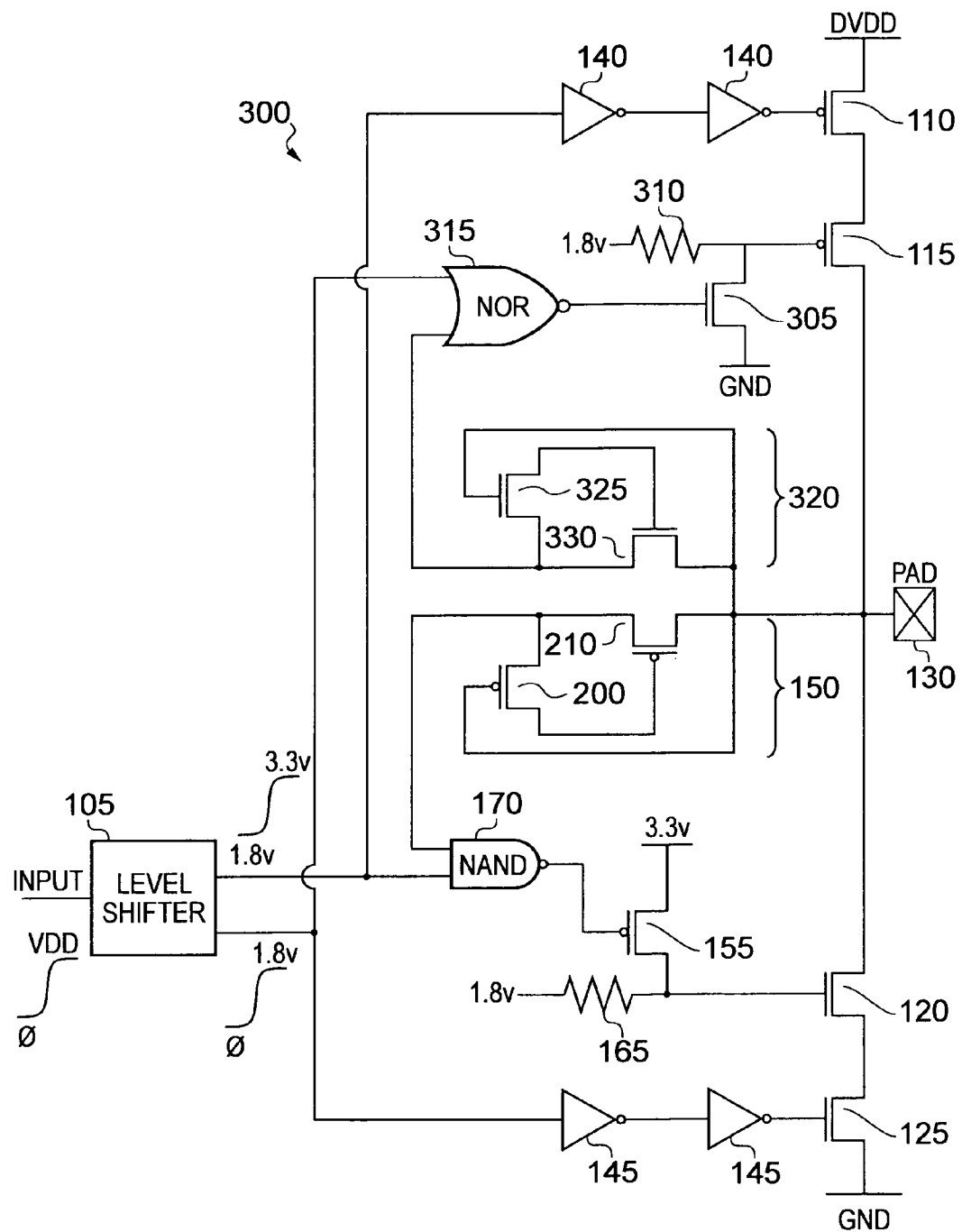
FIG. 5 schematically illustrates a cascoded input-output device according to an embodiment of the present invention.

FIG. 5 schematically illustrates a cascoded input-output device 300 according to another embodiment. In this example embodiment transient VDS stress protection is provided for the cascode switches in both the lower voltage domain of the cascoded input-output device and upper voltage domain of the cascoded input-output device. Here, the level shifter 105 and the whole lower voltage domain are equivalent to those parts of cascoded input-output device 100 as illustrated in, and discussed with reference to, FIGS. 3 and 4, and are not further discussed here.

In the upper voltage domain another bias switch is provided by NFET transistor 305, configured to set a bias voltage on the gate of cascode switch PFET 115. Bias switch 305 selects between a high bias voltage taken from the upper voltage limit of the lower voltage domain (1.8V) via resistor 310 and a low bias voltage taken from GND (0V).

Bias switch 305 is itself controlled by a bias steering signal provided by NOR gate 315. NOR gate 315 receives as its two inputs an inverted version of the clamped voltage provided by clamp circuitry 320 and the lower voltage domain input signal provided by level shifter 105. The clamp circuitry 320 comprises two cross-coupled NFET transistors 325 and 330 and operates in a reverse analogous manner to clamp circuitry 150 (as described with reference to FIG. 4). Thus, clamp circuitry 320 operates such that when the output signal at PAD 130 rises above the defined threshold of the clamped circuitry (in this example the threshold is 1.8V), its generated clamped voltage is clamped as an upper limit at 1.8V. Output voltages below this threshold are passed unclamped.

In the case of the components 305, 310, 315 and 320 under discussion here, the goal is to provide a protected node at the gate of cascode switch PFET 115, such that this switch itself is protected from overstress during transients of the input/output signals. Specifically, this switch would otherwise be vulnerable to VDS stress (an above-tolerance voltage drain-to-source) during a falling transition of the input signal.

When the falling input signal is transmitted by level shifter 105, the output at PAD 130 will still be low, and thus NOR gate 315 activates bias switch 305 to pull down the bias voltage being applied to the gate of PFET switch 115. The voltage on the gate of PFET switch 115 thus decreases to $1.8V-\Delta V_{ref}$, where $\Delta V_{ref}$ depends on the specific implementation requirements, but should be tuned to be sufficient to protect cascode switch PFET 115.

Hence when the upper voltage domain input signal arrives from buffers 140 at driver PFET switch 110, and activates this switch, a sudden increase in the VDS of PFET switch 115 is avoided.

At the same time the lower voltage domain input signal arrives from buffers 145 at driver NFET switch 125, and hence when the driver switches 110 and 125 have switched, the PAD voltage begins to rise.

Once the PAD voltage has risen as far as 1.8V, there is no longer any risk of VDS stress to switch 115. At this point the clamp circuitry 320 clamps the rising output voltage at a maximum of 1.8V (since NOR gate 170 is part of the lower voltage domain and would not tolerate a voltage above 1.8V). Also at this point the NOR gate is receiving a logical 1 (1.8V is the upper limit for the lower voltage domain) and the output of the NOR gate causes bias switch 305 to decouple GND from the gate of PFET 115. By decoupling the GND in this manner, DC dissipation during the non-transient state of the input/output signals is avoided.

Figure 6:
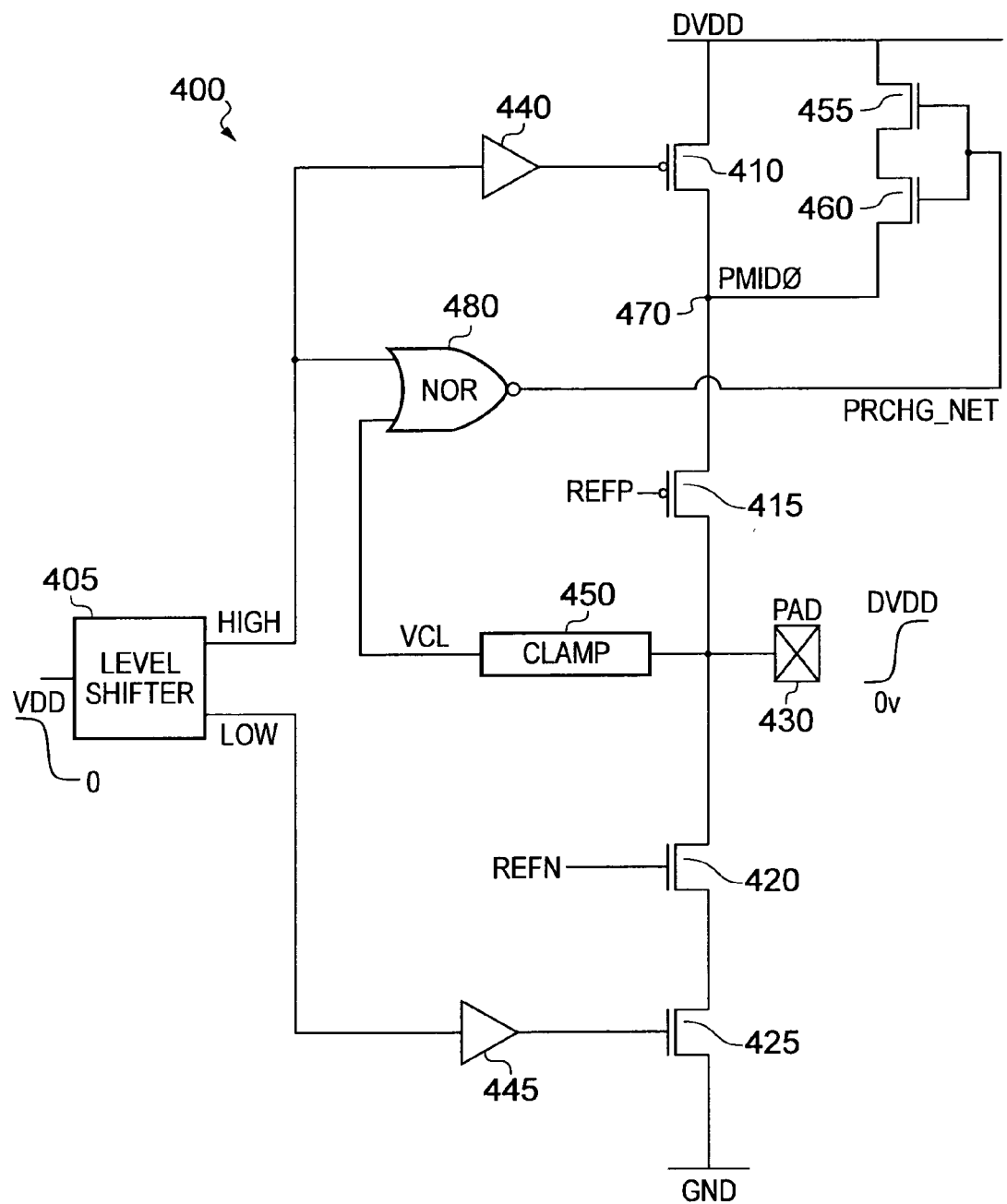
FIG. 6 schematically illustrates a cascoded input-output device according to an embodiment of the present invention.

Turning now to FIG. 6 a cascoded input-output device 400 according to a further example embodiment is schematically illustrated. An input signal is received by level shifter 405 which operates as level shifter 105 does, described with reference to FIGS. 3-5.

On the output side, the output buffer comprises a set of cascoded FET transistors: driver switch PFET 410, cascode switch PFET 415, cascode switch NFET 420 and driver switch NFET 425. The output signal can be seen to be inverted with respect to the input signal. Cascode switches PFET 415 and NFET 420 have their gates tied to bias voltages of REFP and REFN respectively. In a simpler embodiment REFP and REFN could simply be 1.8V, or alternatively a switched bias voltage as described with reference to FIGS. 3-5 could be applied at each of these gates.

The output signal of the device 400 is provided on PAD 430, this output signal being provided in the range 0V to 3.3V, this range being required by the output voltage domain.

The two input signals generated by the level shifter 405 (labelled HIGH and LOW) pass via buffers 440 and 445 to their respective driver switch. The lower voltage domain input signal LOW controls the gate of driver switch NFET 425 and the upper voltage domain input signal HIGH controls the gate of driver switch PFET 410.

Clamp circuitry 450 is also provided to generate a clamped voltage, the clamped voltage being a clamped version of the output signal taken from PAD 430. In this embodiment the clamped voltage is constrained to take a minimum value corresponding to the minimum voltage of the upper voltage domain, i.e. 1.8V.

A bias switch is provided by NFET transistors 455 and 460, configured to set a bias voltage on point PMID0 470 connecting driver PFET switch 410 to cascode PFET switch 415. Bias switches 455 and 460 select between a high bias voltage taken from DVDD (3.3V), and a low bias voltage wherein the voltage at point 470 is only defined by the action of switches 410 and 415.

Bias switches 455 and 460 are controlled in parallel by a bias steering signal PRCHG_NET provided by NOR gate 480. NOR gate 480 receives as its two inputs the clamped voltage provided by clamp circuitry 450 and the upper voltage domain input signal provided by level shifter 405.

In this embodiment the goal is to provide a protected node at the point PMID0 between driver PFET 410 and cascode PFET 415, such that this point is able to charge up faster when the input signal makes a falling transition. This requirement is particularly significant in the illustrated example, since the transistors 410, 415, 420 and 425 of the output buffer are relatively large transistors (in order to be able to drive significant loads off-chip) and hence could potentially take an undesirable length of time to charge up and discharge. In this particular example, the P-side transistors 410 and 415 are larger than those on the N-side 420 and 425, and the node PMID0 in particular needs to be a protected node in that it requires the additional charge to react quickly.

When the falling input signal is transmitted by level shifter 405, the output at PAD 430 will still be low, and thus NOR gate 170 activates bias switches 455 and 460 to pull up the bias voltage being applied to the point PMID0 470. Note that clamp 450 is configured to hold VCL at a level of at least 1.8V.

Hence when the upper voltage domain input signal arrives from buffer 440 at driver PFET switch 410, and activates this switch, a boost in the charging rate of the node PMID0 is provided.

At the same time the lower voltage domain input signal arrives from buffer 445 at driver NFET switch 425, and hence when the driver switches 410 and 425 have switched, the PAD voltage begins to rise.

Once the PAD voltage rises beyond 1.8V, the clamp circuitry 450 allows the rising output voltage to be passed on as signal VCL (since NOR gate 480 is part of the upper voltage domain and would not tolerate a voltage below 1.8V). Also, as VCL continues to rise the NOR gate receives a logical 1 and hence the output of the NOR gate causes bias switches 455 and 460 to decouple DVDD from the point PMID0 470. By decoupling the current source in this manner, transistors 455 and 460 don't affect the output signal.

Furthermore, it has been found that the charge 'boost' provided by these techniques allows a surprisingly large increase in the switching speed of the output buffer.

Although in this example, the charge boost is provided between driver switch 410 and cascode switch 415 to boost current such that this point is able to charge up faster when the input signal makes a falling transition. A similar system could be provided between transistors 420 and 425 to provide a charge boost on a rising transition of the input signal. In such a case, as would be clear to a skilled person the bias switches 455 and 460 would be PFET transistors rather than NFET transistors and would be arranged between the node between transistors 420 and 425 and GND and would act to help pull the node down in response to a rising edge input signal.

Figure 7:
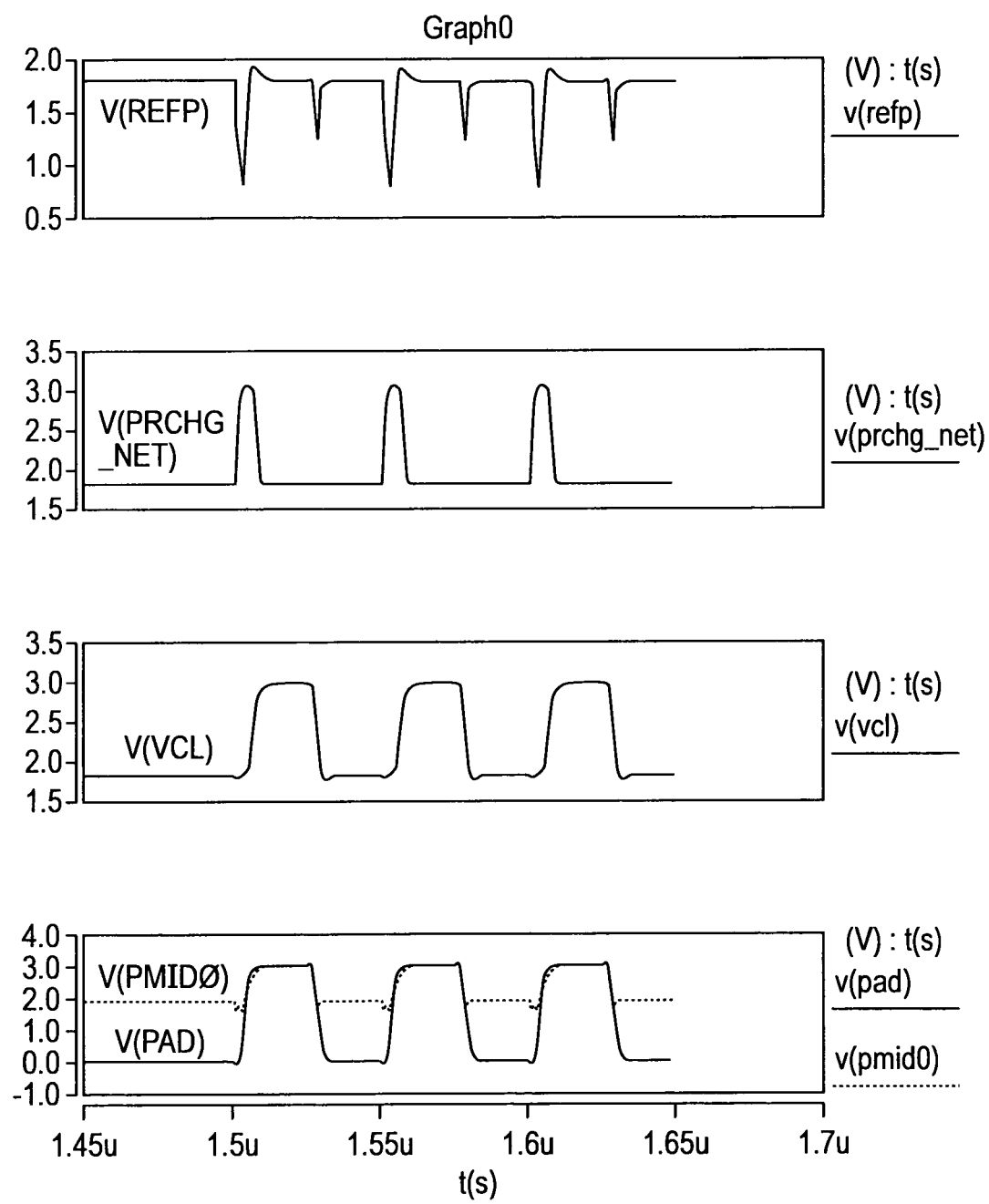
FIG. 7 schematically illustrates selected signals in the embodiment of the present invention illustrated in FIG. 6.

FIG. 7 illustrates the time evolution of selected signals from the embodiment of the present invention illustrated in FIG. 6. These selected signals are the voltages measured at points REFP, PRCHG_NET, VCL, PMID0 and PAD. The bias steering signal PRCHG_NET can be seen to be generated for a brief period on each rising transition of the PAD voltage (falling transition of the input signal), such that no transient fall in the voltage at PMID0 is allowed to occur.

Hence, according to the techniques of the present invention, a cascoded input-output device is provided configured to receive at an input node a lower voltage input signal and to generate at an output node a higher voltage output signal. Splitting the input-output device into two voltage domains enables output signals in a 3.3V range to be generated, whilst the components of the input-output device individually operate in a 1.8V range. By applying a selected bias voltage to a protected node of the cascoded input-output device, first changing that selected bias voltage in response to a transition of the input signal and then switching that selected bias voltage back when the output signal reaches a predetermined level, that node is protected, either avoiding stress-inducing voltage swings or providing a switching speed increasing charge boost.

Figure 8:
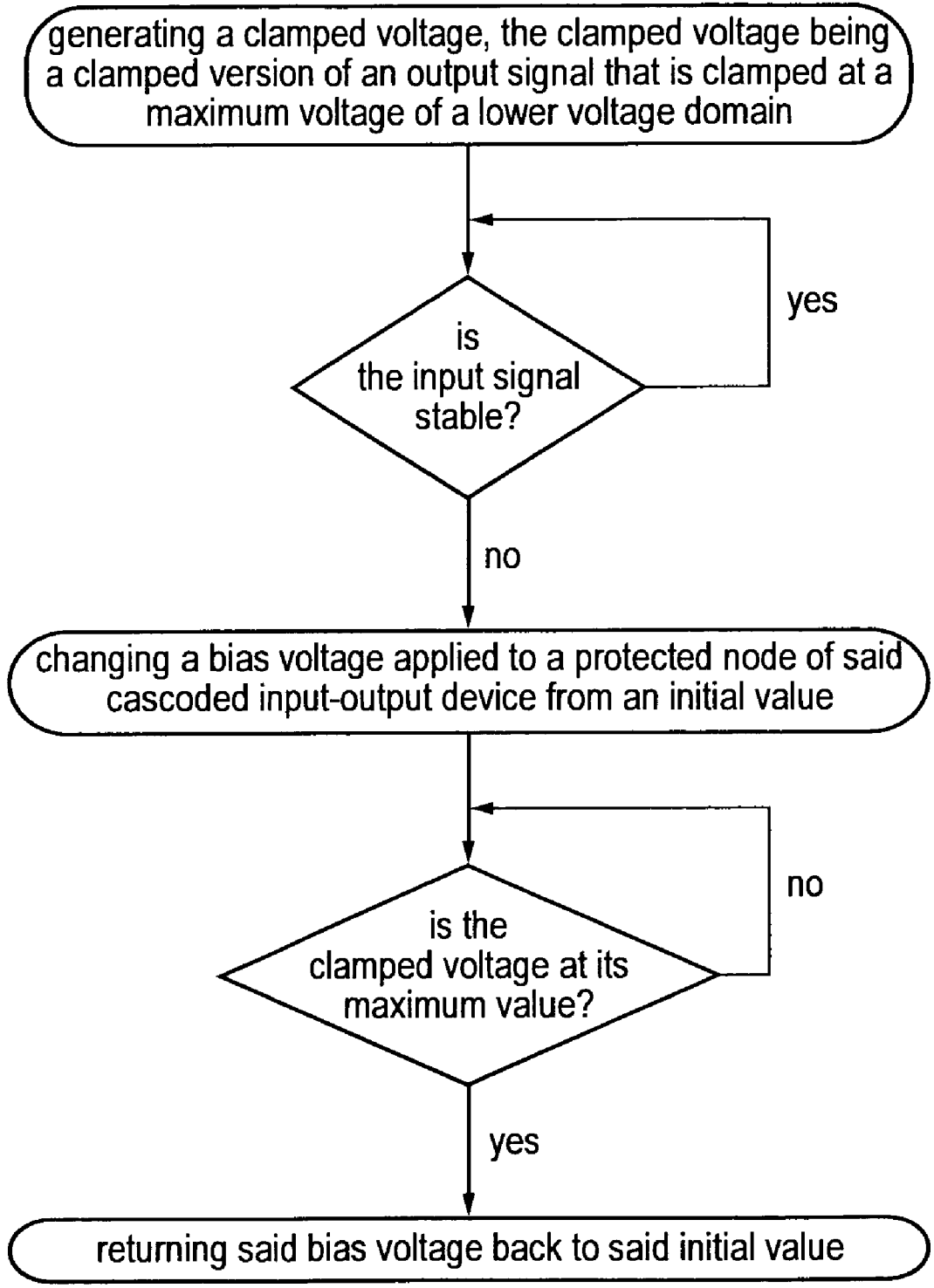
FIG. 8 shows a flow diagram of a method according to an embodiment of the present invention.

FIG. 8 shows a flow diagram of a method according to an embodiment of the present invention. Initially a clamped voltage is generated that is a clamped version of the output signal clamped at a maximum voltage of the lower voltage domain. It is then determined whether the input signal is transitioning or is stable. If it is transitioning, then a bias voltage applied to a protected node the cascoded input-output device is changed from its initial value. This is done either to protect the node from overstressing during the transition or to provide it with a charge boost to assist it in switching. As the change in bias voltage is to aid the system during a transition then at the end of the transition the bias should revert to its initial value. This is done by monitoring the clamped voltage and when this reaches its maximum clamped value then the change to the bias voltage is no longer required and it is returned to its initial value.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A cascoded input-output device configured to receive at an input node a lower voltage input signal and to generate at an output node a higher voltage output signal, said cascoded input-output device having a lower voltage domain and an upper voltage domain, said cascoded input-output device comprising:
    a first driver switch in series with a first cascode switch in said lower voltage domain;
    a second driver switch in series with a second cascode switch in said upper voltage domain;
    a bias switch configured to set a bias voltage selected from a high bias voltage and a low bias voltage in dependence on a bias steering signal, said bias voltage being applied to a protected node of said cascoded input-output device;
    clamp circuitry configured to provide a clamped voltage, said clamped voltage being a clamped version of said output signal and being clamped at a maximum voltage of said lower voltage domain; and
    switch steering circuitry configured to perform bias switching by generating said bias steering signal to cause said bias switch to change said bias voltage from an initial value in response to a transition of said input signal and to cause said bias switch to return said bias voltage back to said initial value in response to said clamped voltage reaching said maximum voltage of said lower voltage domain.

2. The cascoded input-output device as claimed in claim 1, wherein said protected node is a gate of a protected switch, said protected switch being one of said first cascode switch and said second cascode switch; and
    said bias switching provides that a transient overvoltage across said protected switch is avoided.

3. The cascoded input-output device as claimed in claim 1, wherein said protected node is situated between said first driver switch and said first cascode switch; and said bias switching impedes a transient voltage rise at said protected node.

4. The cascoded input-output device as claimed in claim 1, wherein said protected node is situated between said second driver switch and said second cascode switch; and said bias switching impedes a transient voltage drop at said protected node.

5. The cascoded input-output device as claimed in claim 2, wherein said protected switch is said first cascode switch;
    said transition of said input signal is a rising transition;
    said clamped voltage is constrained to be at least said maximum voltage of said lower voltage domain; and
    said switch steering circuitry is configured to cause said bias switch to return said bias voltage back to said initial value in response to said output signal falling to said maximum voltage of said lower voltage domain.

6. The cascoded input-output device as claimed in claim 2, wherein said protected switch is said second cascode switch;
    said transition of said input signal is a falling transition;
    said clamped voltage is constrained to be at most said maximum voltage of said lower voltage domain; and
    said switch steering circuitry is configured to cause said bias switch to return said bias voltage back to said initial value in response to said output signal rising to said maximum voltage of said lower voltage domain.

7. The cascoded input-output device as claimed in claim 1, wherein said first cascode switch is an NFET transistor.

8. The cascoded input-output device as claimed in claim 1, wherein said first driver switch is an NFET transistor.

9. The cascoded input-output device as claimed in claim 1, wherein said second cascode switch is a PFET transistor.

10. The cascoded input-output device as claimed in claim 1, wherein said second driver switch is a PFET transistor.

11. The cascoded input-output device as claimed in claim 4, wherein said low bias voltage is provided by a ground voltage.

12. The cascoded input-output device as claimed in claim 6, wherein said high bias voltage is provided by said maximum voltage of said lower voltage domain.

13. The cascoded input-output device as claimed in claim 5, wherein said low bias voltage is provided by said maximum voltage of said lower voltage domain.

14. The cascoded input-output device as claimed in claim 3, wherein said high bias voltage is provided by said maximum voltage of said upper voltage domain.

15. The cascoded input-output device as claimed in claim 3, wherein said switch steering circuitry comprises a NAND gate.

16. The cascoded input-output device as claimed in claim 4, wherein said switch steering circuitry comprises a NOR gate.

17. The cascoded input-output device as claimed in claim 1, wherein said cascoded input-output device further comprises at said input node a level shifter to convert said lower voltage input signal into a first signal for said lower voltage domain and into a second signal for said upper voltage domain.

18. The cascoded input-output device as claimed in claim 2, further comprising:
    a further protected node situated between said first driver switch and said first cascode switch;
    a further bias switch configured to set a further bias voltage in dependence on a further bias steering signal, said further bias voltage being applied to said further protected node of said cascoded input-output device; and
    further switch steering circuitry configured to perform further bias switching by generating said further bias steering signal to cause said further bias switch to change said further bias voltage from an further initial value in response to said transition of said input signal and to cause said further bias switch to return said further bias voltage back to said further initial value in response to said clamped voltage reaching said maximum voltage of said lower voltage domain,
    wherein said further bias switching impedes a transient voltage rise at said further protected node.

19. The cascoded input-output device as claimed in claim 2, further comprising:
    a further protected node situated between second driver switch and said second cascode switch;
    a further bias switch configured to set a further bias voltage in dependence on a further bias steering signal, said further bias voltage being applied to said further protected node of said cascoded input-output device; and
    further switch steering circuitry configured to perform further bias switching by generating said further bias steering signal to cause said further bias switch to change said further bias voltage from an further initial value in response to said transition of said input signal and to cause said further bias switch to return said further bias voltage back to said further initial value in response to said clamped voltage reaching said maximum voltage of said lower voltage domain, wherein said further bias switching impedes a transient voltage drop at said further protected node.

20. A method of biasing a voltage applied to a protected node in a cascoded input-output device, the cascoded input-output device configured to receive at an input node a lower voltage input signal and to generate at an output node a higher voltage output signal, said cascoded input-output device having a lower voltage domain and an upper voltage domain, said cascoded input-output device comprising:
  a first driver switch in series with a first cascode switch in said lower voltage domain;
  a second driver switch in series with a second cascode switch in said upper voltage domain, the method comprising the steps of:
  generating a clamped voltage, said clamped voltage being a clamped version of said output signal and being clamped at a maximum voltage of said lower voltage domain;
  changing a bias voltage applied to a protected node of said cascoded input-output device from an initial value in response to a transition of said input signal; and
  returning said bias voltage back to said initial value in response to said clamped voltage reaching said maximum voltage of said lower voltage domain.

21. A cascoded input-output device configured to receive at an input node a lower voltage input signal and to generate at an output node a higher voltage output signal, said cascoded input-output device having a lower voltage domain and an upper voltage domain, said cascoded input-output device comprising:
  first driver switch means in series with a first cascode switch in said lower voltage domain;
  second driver switch means in series with a second cascode switch in said upper voltage domain;
  bias switch means for setting a bias voltage selected from a high bias voltage and a low bias voltage in dependence on a bias steering signal, said bias voltage being applied to a protected node of said cascoded input-output device;
  clamp circuitry means for providing a clamped voltage, said clamped voltage being a clamped version of said output signal and being clamped at a maximum voltage of said lower voltage domain; and
  switch steering circuitry means for performing bias switching by generating said bias steering signal to cause said bias switch means to change said bias voltage from an initial value in response to a transition of said input signal and to cause said bias switch means to return said bias voltage back to said initial value in response to said clamped voltage reaching said maximum voltage of said lower voltage domain.

* * * * *